United States Patent [19]
Green et al.

[11] Patent Number: 5,841,278
[45] Date of Patent: Nov. 24, 1998

[54] ELECTROMECHANICAL RF SWITCH ACTIVATED BY EXTERNAL MAGNETIC FIELD

[75] Inventors: Charles Green, Holbrook; Jan Votruba, Ridge; Mark Gelbien, Levittown, all of N.Y.

[73] Assignee: Fonar Corporation, Melville, N.Y.

[21] Appl. No.: 683,626

[22] Filed: Jul. 17, 1996

[51] Int. Cl.[6] .................................................. G01V 3/00
[52] U.S. Cl. .............................................. 324/318; 324/322
[58] Field of Search ..................................... 324/318, 319, 324/320, 321, 322, 300, 307, 309; 128/653.5

[56] References Cited

U.S. PATENT DOCUMENTS

| | | | |
|---|---|---|---|
| 4,766,378 | 8/1988 | Danby et al. ............................ | 324/307 |
| 5,050,605 | 9/1991 | Eydelman et al. ...................... | 324/322 |
| 5,162,738 | 11/1992 | Sepponen ................................ | 324/322 |
| 5,442,291 | 8/1995 | Tyburn et al. .......................... | 324/318 |

OTHER PUBLICATIONS

"Toggle Switch"—two-page schematic designed by Fonar Corporation. (Date of publication unknown).

*Primary Examiner*—Louis M. Arana
*Attorney, Agent, or Firm*—Lerner, David, Littenberg, Krumholz & Mentlik

[57] ABSTRACT

An electromechanical switch for use in a magnetic resonance imaging (MRI) apparatus is constructed of non-magnetic materials and includes a pivotable solenoid operative for moving a contact in response to forces created by interaction between passing through the electromagnet and the primary or static field of the MRI imaging magnet. The switch can be used to disconnect the RF receiver of the MRI apparatus from the receiving antenna during transmission of RF excitation signals.

29 Claims, 7 Drawing Sheets

ELECTROMECHANICAL RF SWITCH ACTIVATED BY EXTERNAL MAGNETIC FIELD

FIELD OF THE INVENTION

The present invention pertains to an electromechanical device for switching radio frequency signals in the presence of an external, static primary magnetic field generated by a magnetic resonance imaging ("MRI") apparatus.

BACKGROUND OF THE INVENTION

Magnetic resonance imaging (MRI) apparatus generate information constituting an image of a solid object, such as an image of the internal organs of a medical patient. This information may be visually displayed in the form of image "slices." MRI apparatus use a strong, substantially constant or static "primary" magnetic field which passes through the patient's body or other object to be imaged. Additional "gradient" magnetic fields, varying with time, typically are superimposed on the primary magnetic field. The patient is also exposed to radio frequency ("RF") excitation which varies with time in particular patterns. Under the influence of these magnetic fields and the RF excitation signals, certain atomic nuclei within the patient's tissue resonate and emit RF response signals. The response signals are captured by an RF antenna positioned near the patient and amplified and demodulated by a receiver circuit. Using well-known techniques, the information, constituting the image, is recovered from the RF response signals.

The RF excitation signal is transmitted by the MRI apparatus at relatively high power, typically hundreds or thousands of watts. By contrast, the power of the received RF electromagnetic response signal generated by the patient is many magnitudes weaker, typically milliwatts or microwatts. The receiver typically includes a multi-stage amplifier circuit with a sensitive pre-amplifier, used to boost the very weak RF response signal received from the patient. If the transmitted RF excitation signal were applied to the pre-amplifier, it would be overloaded and damaged. Therefore, the pre-amplifier should be electrically protected from the RF excitation signal.

In some MRI apparatus, the receiving antenna used to receive the RF response signal is separate from the transmitting antenna used to send the excitation signal, and the two antennas are substantially orthogonal to one another. Thus, the elements of the antennas are arranged so that little or no RF power in the excitation signal is coupled to the receiving antenna. However, in certain cases it is desirable to use the same antenna both as a transmitting antenna and as a receiving antenna. For example, as disclosed in certain preferred embodiments of copending, commonly-assigned United States Patent Application of Charles Green et al. entitled Magnetic Resonance Imaging Excitation and Reception Methods and Apparatus filed of even date herewith, the disclosure of which is hereby incorporated by reference herein, the receiving antenna may be included in a resonant circuit which is driven by RF excitation signals sent through free-space transmission from another antenna, so that the receiving antenna will reradiate the RF excitation signals into the patient. Alternatively, the receiving antenna may be directly driven with the excitation signals through a wired connection so that the receiving antenna radiates the excitation signal. In either instance, the receiving antenna is energized with a substantial portion of the power in the excitation signal, and additional measures must be employed to isolate the pre-amplifier and other elements of the receiving circuit from the receiving antenna during application of the excitation signal.

Decoupling of the pre-amplifier of the receiver from the receiving antenna during the period of transmission of the excitation signal creates a number of practical problems. For example, there have been attempts to use semiconductor switches in the MRI environment. However, these switches have altered the electrical characteristics of the antenna circuit in a way which impairs receiver performance. Accordingly, it is desirable to use a moving mechanical contact, rather than a semiconductor switch, for connecting and disconnecting the receiving antenna and the receiver. However, the excitation signal typically is generated in a series of timed pulses of relatively short duration, i.e., about 2 to 10 ms pulses about every 15 to 100 ms. The receiver may be active to receive the response signal from the patient for a substantial portion of the time between excitation signal pulses, commonly for about 30 ms to 50 ms between each pair of pulses. This pulse transmission and reception cycle requires a switching device which is capable of switching between the transmitting and receiving modes of operation within a few milliseconds so as to switch between modes in synchronism with the transmitting and receiving intervals of an MRI imaging cycle.

In addition, it is generally preferred that any switching device be located as close as possible, and preferably mounted to, the RF receiving antenna in order to eliminate losses of the low power response signal captured by the receiving antenna. Because the receiving antenna is mounted on or near the patient, any device mounted near the receiving antenna will be disposed within the magnetic field of the MRI apparatus. It is well known that placement of ferromagnetic material within the primary magnetic field would distort the field and would degrade the image produced by the apparatus.

Moreover, the receiving antenna structure often is supported by the patient as, for example, where the receiving antenna structure is a coil which encircles the patient's body. A switching device mounted to such a receiving antenna should be compact and lightweight. The switching device should be manufacturable at reasonable cost, and should be simple and reliable. All of these requirements taken together present a considerable challenge.

An example of an electromechanical switch for use in an MRI apparatus is a switch previously used in MRI apparatus sold by the assignee. That switch was used for infrequent switching between one receiving coil and another receiving coil after the completion of an MRI imaging cycle. It includes a standard, off-the-shelf toggle switch. The toggle switch includes a housing and a lever arm extending outwardly from the housing. A non-ferromagnetic bobbin, having a hollow, cylindrical center, is slidably mounted on the end of the lever arm remote from the housing. A plurality of current-carrying coils of non-ferromagnetic material are wound about the bobbin to create an electromagnet. In operation, the switch was positioned within the primary magnetic field in such a way that when the current was supplied, the field created by the electromagnet tended to align the electromagnet with the primary magnetic field created by the primary magnet in the MRI apparatus. This moved the lever from the first position to a second position.

This switch, however, was only usable for switching between coils after completion of an MRI imaging cycle. It was incapable of timely switching at millisecond speed, and could not be used for switching between transmitting and receiving intervals of an MRI imaging cycle.

SUMMARY OF THE INVENTION

One aspect of the present invention provides an electromechanical switch that resolves these problems and limitations, as well as satisfies an unsolved need for a switch operative in an MRI environment, capable of synchronous switching.

A switch according to this aspect of the invention is adapted for use in a magnetic resonance imaging (MRI) apparatus which is operative for creating a first magnetic field. The switch includes a frame of non-magnetic material, a first secondary contact supported by the frame, an electromagnet formed from non-ferromagnetic material, the electromagnet being movably supported within the frame, and a primary contact carried on the electromagnet for movement therewith between a first position in which the primary contact engages the first secondary contact and a second position in which the primary contact is out of engagement with the first secondary contact. The electromagnet is arranged so that upon application of a current having a first polarity to the electromagnet, in the presence of the first magnetic field of the MRI apparatus, the electromagnet moves relative to the frame to move the primary contact to the first position and into electrical contact with the first secondary contact, and upon application of a current having a second polarity to the electromagnet in the presence of the first magnetic field, the electromagnet moves relative to the frame so as to move the primary contact to the second position, out of engagement with the first secondary contact. Most preferably, the switch includes a second secondary contact, and the primary contact is in engagement with the second secondary contact when the primary contact is in the second position. Preferably, the electromagnet is mounted pivotably to the frame for movement about a support axis, and the primary contact is carried on the electromagnet. The electromagnet desirably is in the form of a solenoid.

In accordance with another aspect of the present invention, there is provided an electromechanical switch for use in a magnetic resonance imaging (MRI) apparatus which is operative for creating a first magnetic field. The switch according to this aspect of the invention comprises a frame of non-magnetic material, a pair of spaced apart secondary contacts supported by the frame and a solenoid including a body of non-magnetic material and a plurality of current carrying coils of non-ferromagnetic material wound about the body. The solenoid defines a solenoid axis extending through the body within the coils. The solenoid is pivotably supported within the frame for movement about a support axis which is arranged orthogonal to the solenoid axis. A primary contact is mounted to the body for movement therewith between first and second positions, the primary contact having a portion located remote from the support axis for contacting the secondary contacts. The switch according to this aspect of the invention further includes means for supporting the frame within the first magnetic field created by the MRI apparatus so that both the solenoid axis and the support axis are transverse to the direction of the first magnetic field. Thus, upon application of a current having a first polarity to the coils of the solenoid, the body will pivot about the support axis in a first direction, thereby moving the primary contact to the first position and into engagement with one of the secondary contacts. When a current, having a second polarity opposite to the first polarity, is applied to the coils of the solenoid, the body pivots in the opposite direction about the support axis to move the primary contact to the second position and into engagement with the second secondary contact. Most preferably, the frame is mounted to a receiving antenna structure of the type which is supported by the patient during operation of the device. Thus, the receiving antenna structure serves as the means to support the frame in the orientation referred to above, with the solenoid axis and support axis transverse to the primary magnetic field of the MRI apparatus.

Switches according to the foregoing aspects of the invention most preferably are adapted for synchronous switching, between transmit and receive intervals of an MRI imaging cycle. Thus, the switches according to these aspects of the invention preferably are arranged to switch between positions during switching intervals as short as a few milliseconds.

Further aspects of the invention include the combination of switches as aforesaid in combination with MRI apparatus.

In accordance with another embodiment of the present invention there is provided a method for connecting and disconnecting an RF receiving antenna and a receiver during operation of an MRI apparatus. Methods according to this aspect of the invention include the steps of providing a primary magnetic field by operation of an MRI apparatus, positioning a switch including a non-ferromagnetic frame and a non-ferromagnetic electromagnet within the primary magnetic field, and connecting a primary contact mounted to the electromagnet and a first secondary contact mounted to the frame between the RF receiving antenna and the receiver. The method further includes the step of supplying a current of a first polarity to the electromagnet to thereby move the electromagnet relative to the frame so as to engage the primary contact and the first secondary contact and provide the first closed electrical circuit, and supplying a current of a second polarity to the switch to move the electromagnet to a second position in which the primary contact and the first secondary contact are disengaged, and thereby break the circuit between the antenna and the receiver. These steps are performed during the MRI imaging cycle, so that the connection between the receiving antenna and the receiver is broken before the excitation signal is applied during each transmit interval of the cycle and made before the response signal is acquired during the next receive interval of the cycle. Preferably, the primary contact engages a second secondary contact while in the closed position and connects the antenna in a further closed electrical circuit.

Yet another aspect of the invention provides methods of operating MRI apparatus using at least two antennas. Methods according to this aspect of the invention include the steps of providing the primary magnetic field in the patient-receiving space, and applying RF excitation signals during a series of transmit intervals. Methods according to this aspect of the invention further include the step of receiving RF response signals through a first receiving antenna during a series of first receive intervals interleaved between the transmit intervals, and receiving RF response signals through a second receiving antenna during a series of second receive intervals interleaved between the transmit intervals and first receive intervals. The method further includes the step of actuating a switch as discussed above during the MRI imaging cycle, between the first and second receive intervals, so as to connect a receiver to the first antenna during each first receive interval, and to connect the receiver to the second antenna during each second receive interval. Methods according to this aspect of the invention can be used to acquire images of body parts which are remote from one another, such as two breasts or both sides of a jaw. In addition, this particular aspect allows an MRI apparatus to scan the entire length of the spine through the use of an array of coils sequentially switched.

According to a further aspect of the invention, the receiver can be connected to differently tuned antenna circuits, resonant at two different frequencies, during the first and second series of interleaved receive intervals, and the receiver is actuated to receive MRI response signals at the two different frequencies during the two different receive intervals. Thus, the switching action may connect completely different antenna circuits to the receiver during the different receive intervals, or may connect and disconnect a tuning element such as a capacitor in one antenna circuit so as to provide the two differently tuned circuits during the different transmit and receive intervals. Methods according to this aspect of the invention can be used to gather imaging data representing different atomic nuclei having different Larmor resonance frequencies in the same MRI imaging cycle. For instance, one antenna circuit can be tuned to a hydrogen atom's resonant frequency where another antenna circuit can be tuned to a nitrogen atom's resonant frequency.

BRIEF DESCRIPTION OF THE DRAWINGS

The above description, as well as further objects, features and advantages of the present invention will be more fully understood with reference to the following detailed description of the preferred embodiments, when taken in conjunction with the accompanying drawings, wherein.

Each of FIGS. 6 through 9 is a partial electronic circuit diagram depicting a different embodiment of the invention.

Figure 10:
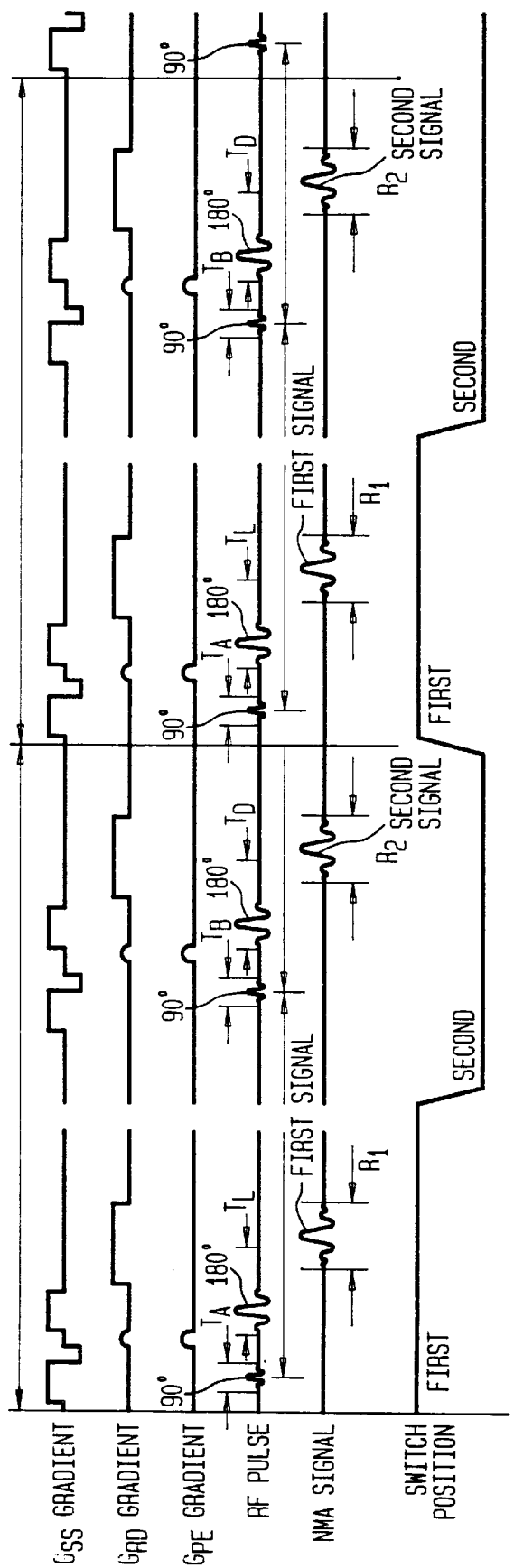

FIG. 10 is a graphical representation of pulse sequences and response signals during a method in accordance with one embodiment of the invention.

DETAILED DESCRIPTION OF THE PREFERRED EMBODIMENTS

Figure 1:
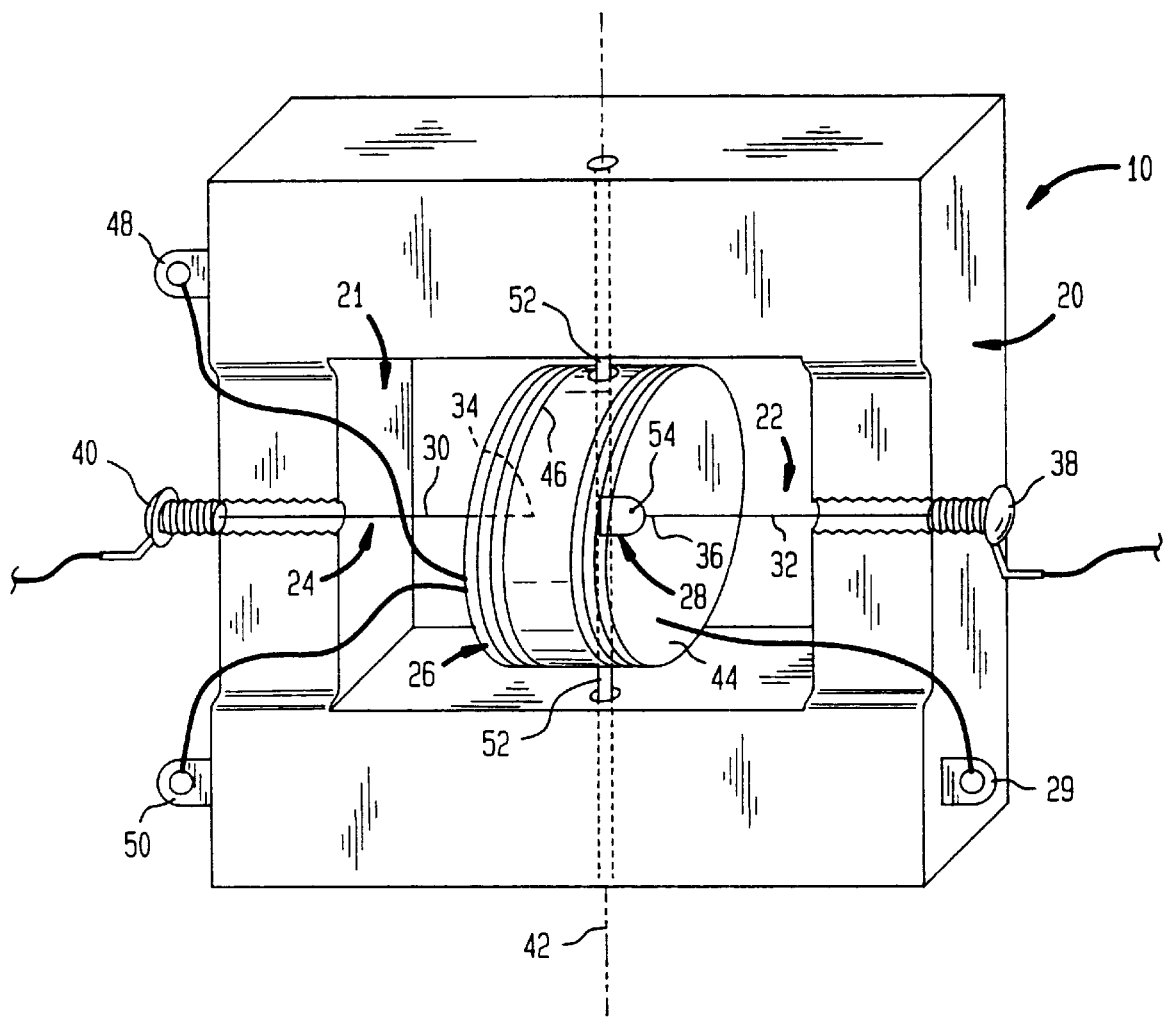
FIG. 1 is a diagrammatic perspective view of an electromechanical switch according to one embodiment of the present invention.
Figure 2:
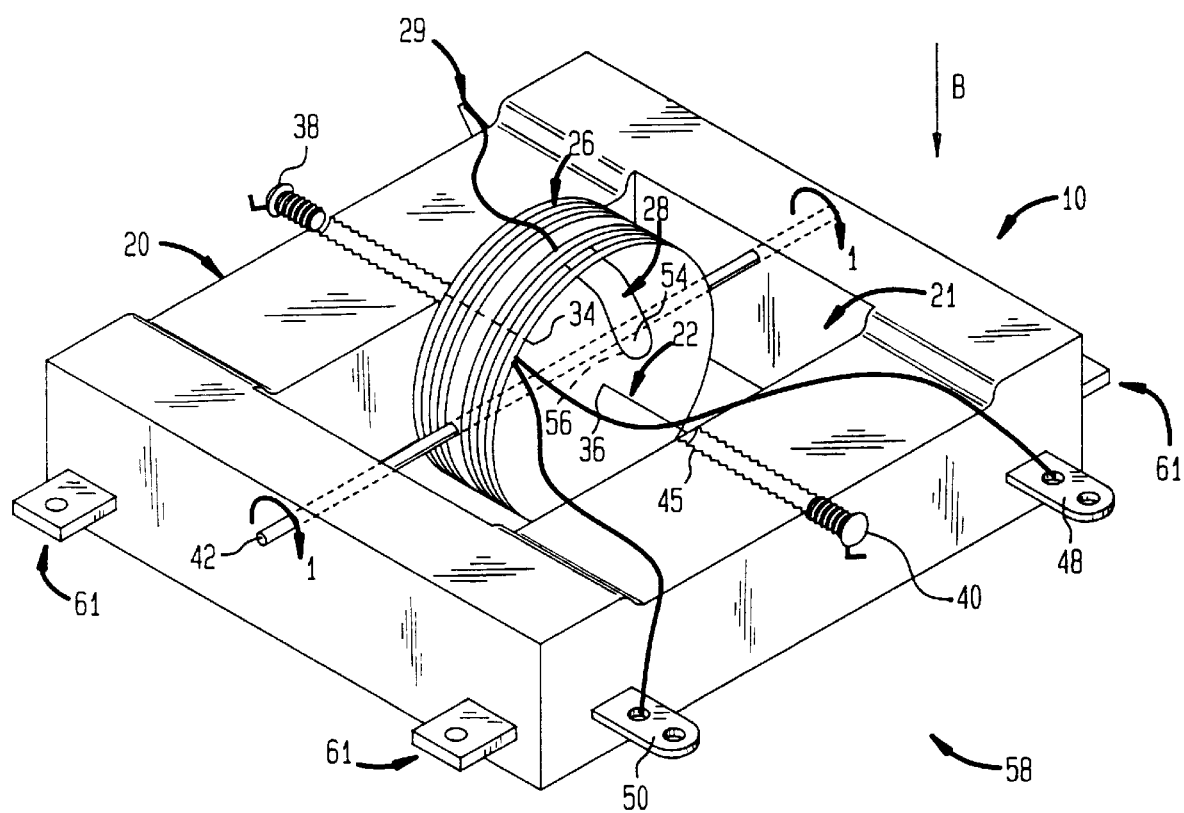
FIG. 2 is a diagrammatic perspective view of the switch of FIG. 1 looking from a different direction.

Referring to FIGS. 1 and 2, an electromechanical RF switch constructed in accordance with one embodiment of the present invention is generally designated by reference numeral 10. The switch 10 is particularly suited for use in a magnetic field created by the operation of an MRI apparatus such as disclosed in U.S. Pat. No. 4,766,378, the operation of which is well known in the art. The switch 10 is generally constructed from a non-magnetic frame 20, a pair of spaced apart secondary contacts 22, 24, a solenoid 26 and a primary contact 28.

The frame 20 is shaped to provide a center cavity 21 in which the solenoid 26 is pivotably supported. Although the frame 20 is illustrated as having a rectangular shape, other shapes such as round, oval, etc. are also suitable. The material for the frame can be any durable, non-ferromagnetic material. Dielectric materials such as plastic, wood, ceramic or the like are preferred. Most preferably, the frame 20 is constructed from plastic material due to its ease of fabrication and low cost.

The secondary contacts 22, 24 are in the form of elongated rods 30, 32 which extend inwardly and opposite to one another through the side walls of the frame 20. The secondary contacts 22, 24 are constructed of non-ferromagnetic electrically conductive material such as copper and the like. The free opposed ends of the secondary contacts within cavity 21 provide contact terminals 34, 36. Electrical connection between the secondary contacts 22, 24 and external circuitry is made through by a pair of stationary terminals 38, 40 electrically connected to the secondary contacts and mounted to the outside of the frame 20. The two secondary contacts 22, 24 are longitudinally adjustable within the frame 20 to adjust the space between their contact terminals 34, 36 as described below.

An electromagnet in the form of a solenoid 26 is mounted within the center cavity 21 of the frame 20 for pivotal movement about the support axis 42 between a first position and a second position. The solenoid 26 includes a hollow cylindrical body 44 having a central axis 45 intersecting support axis 42, the central axis of the cylinder being perpendicular to the support axis. The cylinder has a wire winding 46 capable of conducting electricity disposed upon its outer surface in the form of a helical solenoid coaxial with the central axis 45 of the cylinder, so that the turns of the winding encircle the axis. The solenoid 26 is constructed from non-ferromagnetic materials. In particular, the cylindrical body 44 can be constructed from a variety of materials similar to that of frame 20, and preferably plastic material. The electrically conductive winding or coil 46 can be constructed from such non-ferromagnetic materials as silver, copper, aluminum and alloys thereof Copper is preferred due to its ready availability in wire form, low electrical resistance, and ease of manipulation into windings or coils 46. Coil 46 may include from about 20 to about 50 turns, about 20 mm in diameter, and may have a total inductance of from about 10 to about 20 $\mu$H. The free ends of the wire winding or coil 46 are electrically connected through flexible leads formed from the same wire as the coil to a pair of solenoid terminals 48, 50 which are mounted on frame 20. The solenoid terminals 48, 50 are used for application of current to the solenoid 26 for operation of the switch 10.

The solenoid 26 is pivotably mounted to the frame 20 by means of elongated stiff rods 52, also made of a non-ferromagnetic material. The rods 52 are secured through opposing side walls of the frame 20, by any securing means as, for example, friction, riveting, mechanical engagement with the frame or adhesives, and preferably riveting. The free ends of the rods 52, protruding inwardly from the frame, are rotatably received in bores extending into the wall of the cylindrical body 44. This arrangement allows the solenoid 26 to pivot freely about the support axis 42 during operation of the switch 10.

The primary contact 28 is mechanically coupled to the solenoid 26, and specifically, is mounted on the inside of the cylindrical body 44 remote from the central axis 45 of the cylinder and remote from support axis 42. The primary contact 28 is provided with two opposing face terminals 54, 56. The primary contact is disposed between the terminals 34, 36 of the secondary contacts 22, 24, so that in a first position of the solenoid, face terminal 52 of the primary contact abuts terminal 34 of the first secondary contact 22, whereas in a second position of the solenoid, face terminal 54 of the primary contact abuts terminal 36 of the second secondary contact 24. The contacts thus limit the range of pivoting motion of the solenoid to a small arc, typically a few degrees of arc. Thus, the axis 45 of the solenoid remains within a few degrees of the plane defined by frame 20. A contact terminal 29 is mounted to the frame 20 to enable electrical connection to the primary contact 28. Contact 29 is electrically connected to the primary contact 28 by a flexible lead.

Figure 3:
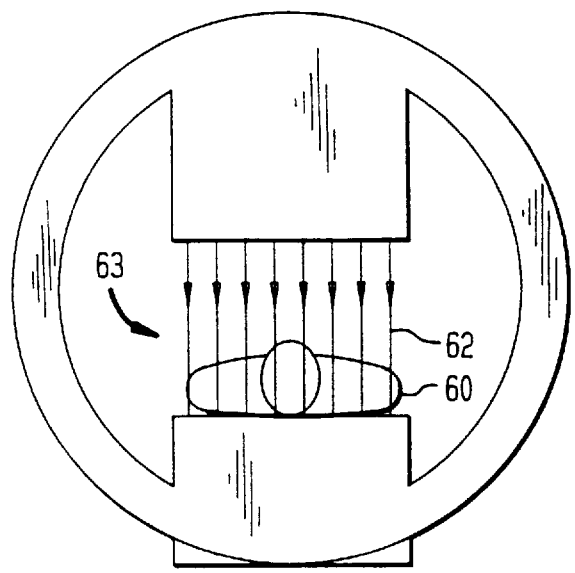
FIG. 3 is a diagrammatic front elevational view of an MRI apparatus as used with the switch of FIG. 1 to provide a static primary magnetic field.
Figure 4:
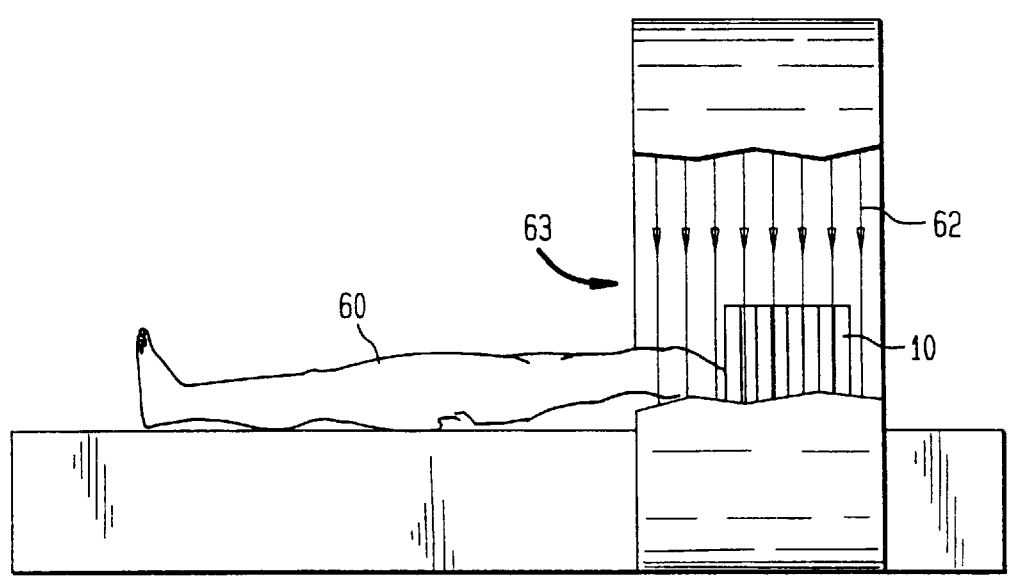
FIG. 4 is a diagrammatic side elevational view of the MRI apparatus as shown in FIG. 3.

In operation as shown in FIGS. 2, 3 and 4, the electromechanical switch 10 frame 20 of switch 10 is provided with mounting devices such as nonmagnetic fasteners 61 for securing the frame 20 to the loop-like, body-encircling structure of an RF antenna 58 which is positioned about a portion of the patient's body 60 and supported by the patient. The RF antenna may be of the type disclosed in U.S. Patent No. 5,050,605 or other body-mounted type. The mounting arrangement is configured so that the plane of frame 20, and hence the common plane of the support axis 42 and solenoid axis 52, is generally tangent to the loop-like structure. That is, the solenoid axis 45 does not extend through the antenna structure into the region occupied by the patient. As best seen in FIGS. 3 and 4, the portion of the patient's body to be imaged, antenna structure 58, and hence switch 10 are disposed within the static primary magnetic field 62 generated by the MRI apparatus. The static primary magnetic field 62 acts as the external magnetic field for operation of the switch 10.

The position and orientation of the switch 10, and the orientation of the frame 20 with respect to the antenna structure 58, are selected so that the common plane of the support axis 42 and the solenoid axis 45 is transverse to the direction of the magnetic field 62, i.e., transverse to the direction of the field vector B and hence transverse to the lines of flux constituting the field.

Figure 5:
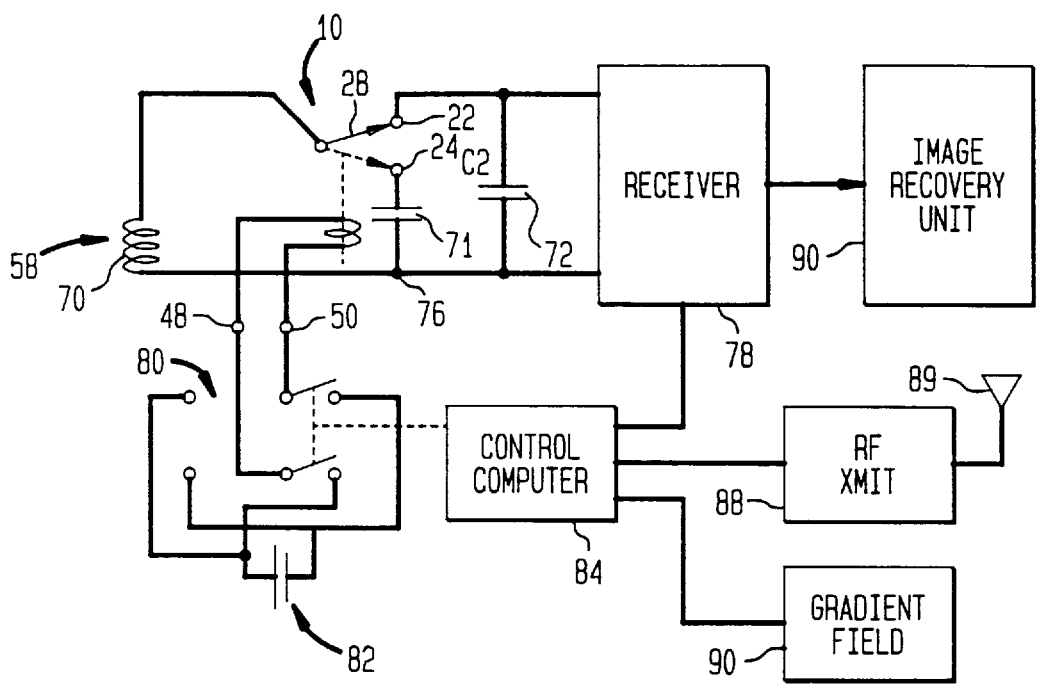
FIG. 5 is a block diagram of an electronic circuit electrically connected to the switch of FIG. 1.

The switch 10 is electrically connected to the antenna circuit and receiver as illustrated in FIG. 5. The electrical elements of the antenna are symbolized by an inductance 70 and capacitance 71. These elements are connected to the primary contact 28 of the switch, and to a grounded circuit node 76. Node 76, in turn, is connected to the second secondary contact 24 of the switch, as well as to the ground terminal of the RF receiver 78 of the MRI apparatus. Receiver 78 is of the conventional type used in MRI apparatus, and incorporates a sensitive preamplifier adapted to boost the RF response signal. The first secondary contact 22 of the switch 10 is connected to the response signal input terminal of the receiver 78. A capacitor 72 is connected across the receiver, between the signal input terminal and the ground node 76. The solenoid terminals 48,50 and hence the winding of solenoid 26 are connected to a switching device 80, which in turn is connected to a potential source 82. The potential source may be a battery, rectifier or other source of DC potential. Switching device 80 may be a double-pole, double-throw relay-actuated switch as symbolized in the drawing, or else may be a semiconductor switching arrangement or other device capable of connecting terminal 48 to the positive terminal of potential source 82 while connecting terminal 50 to the negative terminal of the potential source under one condition, and of making the opposite connection (terminal 48 negative, 50 positive) under another condition. The switching device 80 is linked to the control computer 84 of the MRI apparatus and arranged so that the control computer can actuate the switching device. Thus, as commanded by the control computer, the switching device 80 and potential source 82 will apply either of two opposite potentials across the windings.

With the components connected and positioned in this manner, the control computer 84 of the MRI apparatus actuates the MRI apparatus in the conventional manner to perform a series of repetitive cycles. During each cycle, the control computer actuates the RF transmitter 88 of the MRI apparatus to direct RF excitation signals into the space within the magnet assembly occupied by the patient 60 during a transmit interval, and then the control computer actuates receiver 78 to acquire the RF response signals captured by antenna 58 during a receive interval. RF transmitter 88 is provided with a separate transmitting antenna 89 mounted within the patient-receiving space of the magnet assembly, and the transmitted RF signals are emitted into the patient-receiving space.

During various portions of the cycle, the control computer 84 also actuates gradient field devices 90 in the conventional manner to encode the response signals with spatial information. In the conventional manner, the gradients are varied during different cycles. The image recovery unit 90 accumulates the information from response signals acquired during numerous cycles and reconstructs an image in the conventional manner.

Immediately prior to the receive interval of each cycle, control computer 84 actuates coil power switch 80 and potential source 82 to provide a current having a first polarity to the coils 46 of the solenoid 26. The flow of electric current will cause the solenoid 26 to generate a magnetic field with a predetermined orientation. As the switch is maintained within the strong static magnetic field of the MRI apparatus, the solenoid 26 will tend to align the solenoid axis 45 with the static magnetic field 62 by pivoting about rods 52 and support axis 42 in the first direction, indicated by arrow 1 in FIG. 2. In effect, the solenoid and the primary field magnet of the MRI unit form an electric motor, with the primary field magnet constituting the stator and the solenoid constituting the rotor. The current passing through those portions of the coil disposed above axis 45 causes a magnetomotive force to the right as seen in FIG. 2, whereas the current passing through those portions of the coil disposed below axis 45 causes a magnetomotive force in the opposite direction, thus applying a torque to the solenoid about support axis 42. This, in turn, will cause the solenoid 26 and primary contact 28, to move to the first position referred to above, in which the first face 54 of primary contact 36 abuts the terminal 36 of the first secondary contact 22. This electrically connects the primary contact 36 to the first secondary contact 22. This completes a first electrical circuit including the antenna 58, with capacitance 72 and inductance 70, and receiver 78. Due to the internal capacitance 72 and inductance 70 of the receiving antenna, this circuit is resonant at the frequency of the response signal. The current to the solenoid 26 is continually applied during the receive interval of the cycle, so as to continually maintain the antenna electrically connected to the receiver.

Immediately prior to the transmit interval of each cycle, the control computer actuates the switching device 80 and potential source 82 to direct a current of the opposite polarity through the coil of solenoid 26, thereby moving the solenoid and the primary contact in the direction opposite to arrow 1 in FIG. 2 to a second position, in which primary contact 28 abuts the second secondary contact 24 and these contacts are electrically connected to one another. This current is maintained so as to maintain the solenoid 26 and primary contact 28 in the second position throughout the transmit interval. Thus, during the transmit interval, antenna 58 is effectively disconnected from receiver 78, and effectively connected in a closed loop circuit. Due to the internal capacitance 71 and inductance 70 of the receiving antenna, the closed loop circuit is resonant at the frequency sent by the transmitter 88. During the transmit interval, the closed loop circuit will be driven by the transmitted signal and will reradiate some RF power into the patient 60.

Because the switch 10 is completely non-ferromagnetic, the switch components do not cause any distortion of the static primary magnetic field of the MRI apparatus needed to create sharp computer-enhanced images. Surprisingly, even though operation of the switch entails generation of some magnetic field by the solenoid, that added magnetic field does not interfere with the magnetic fields of the MRI apparatus to any appreciable extent, and does not cause any appreciable degradation of the image. In this regard, it should be noted that the static magnetic field of the MRI apparatus is quite strong, typically about 1 kiloGauss or more, and most preferably about 3 to about 6 kiloGauss. The torque produced by the current directed through the solenoid is proportional to the product of the static field strength and the current, as well as to the number of turns and the diameter of the solenoid. Therefore, only a small current, typically less than about 1 amperes, need be applied to the coil during operation. The total magnetic flux produced by the coil is only about $7 \times 10^{-8}$ Weber. Also, in the preferred mounting arrangements, the coil is disposed outside of the patient, remote from areas near the center of the patient's body which are to be imaged. With a solenoidal electromagnet of the type used in the preferred embodiments discussed above, the flux is directed generally along the axis 45 of the solenoid 26. In the preferred mounting arrangements, that axis does not pass through the patient's body. Because the switch 10 is completely electromechanical, there are no discrete or semi-conductor devices included therein. Therefore, the switch 10 does not destroy the high Q or sharply resonant characteristic of the antenna system during the receive or transmit interval.

Figure 6:
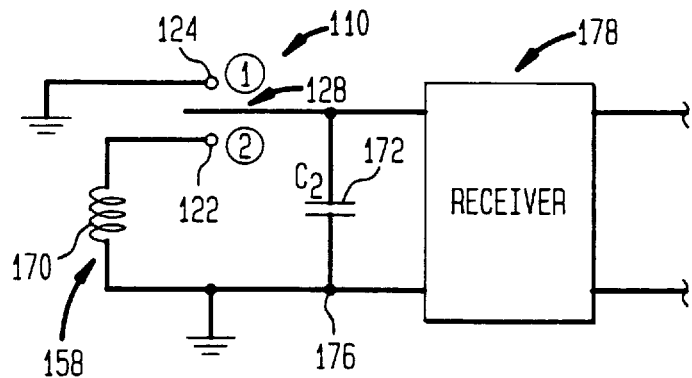

In apparatus according to a further embodiment of the invention, the switch 110 is electrically connected to the antenna circuit and receiver as illustrated in FIG. 6. The primary contact 128 of the switch is connected to the receiver 178 and capacitor 172. The second secondary contact 124 of the switch is connected to ground, whereas the first secondary contact 122 is connected to the antenna circuit 158 including receiving antenna 170. During each transmit interval, the switch 110 is in a second position, with the primary contact 128 of the switch is connected to the second secondary contact 124. Thus, during the transmit interval, the antenna circuit 158 is disconnected from the receiver 178 and the receiver 178 is protected by shorting its input to ground. During each receive interval, the switch is in the first position, with the receiver 178 connected to antenna circuit 158 through the primary contact 128 and the first secondary contact 122. In other respects, the apparatus according to this embodiment of the invention functions in the same way as described above.

Figure 7:
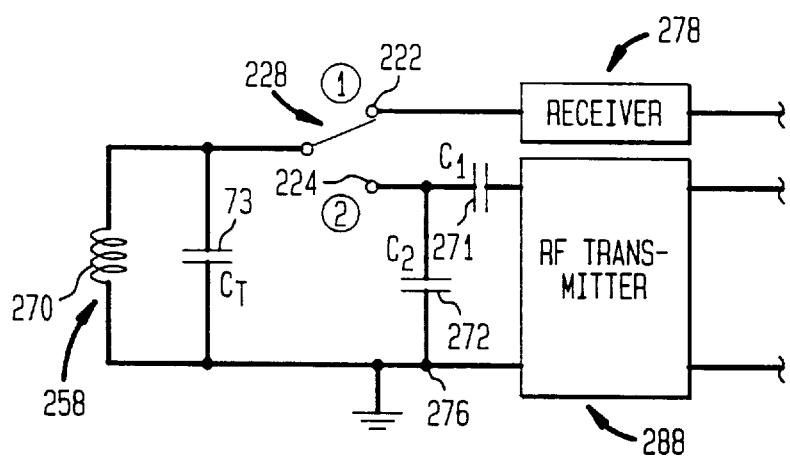

In the embodiment of FIG. 7, the primary contact 228 switch 210 is permanently connected to an antenna circuit 258 including antenna 270 and capacitance 273. A first secondary contact 222 is connected to receiver 278. A second secondary contact 224 is connected to the RF transmitter 288 through a network of impedance matching capacitors 271 and 272. In the first position of the switch, used during receive intervals, primary contact 228 and hence antenna circuit 258 are connected to the receiver 278. In a second position, used during transmit intervals, the primary contact 228 and antenna circuit 258 are connected to the second secondary contact 224. This completes a second electrical circuit including the antenna 270, capacitances 271, 272 and 273 and the RF transmitter 288. In this configuration, the antenna 270 acts as both the transmitting antenna as well as the receiving antenna.

Figure 8:
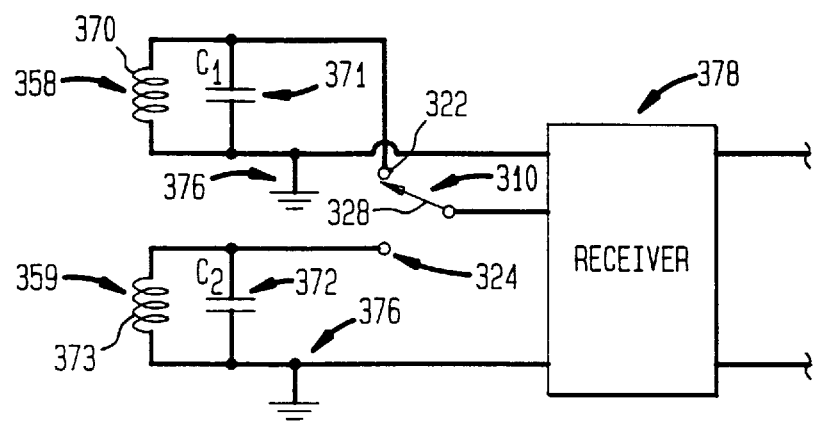

In the embodiment depicted in FIG. 8, the switch 10 is electrically connected between two separate antenna circuits 358 and 359 and the receiver 378. In this configuration, antenna circuit 358 includes antenna 370 and capacitance 371, whereas antenna circuit 359 includes antenna 373 and capacitance 372. The primary contact 328 of switch 310 is connected to the signal input of the receiver 378. First secondary contact 322 is connected to the first antenna circuit 358, whereas the second secondary contact 324 is connected to the second antenna circuit 359. Switch 310 is arranged in the same manner as discussed above so that the primary contact can be moved rapidly, within a few milliseconds, between a first position in which the primary contact engages first secondary contact 322 and a second position in which the primary contact engages the second secondary contact 324 by applying a current of one polarity through an electromagnet (not shown) incorporated in the switch, and so that the primary contact can be moved back to the first position by applying a current of the opposite polarity through the electromagnet. Thus, the two antenna circuits can be sequentially switched in and out of an electrical circuit with the receiver 378. Apart from the elements illustrated in FIG. 8, the other elements of the MRI imaging apparatus are as described above. Thus, the apparatus includes a primary field magnet, control computer, RF transmitter, gradient field unit and image recovery unit similar to the corresponding elements shown in FIGS. 1–5.

In one arrangement, the two antennas in the circuit of FIG. 8 are located remote from each other, so that each antenna is disposed adjacent a different portion of the patient's body which is to be imaged. For example, antenna 370 may be disposed adjacent one tempromandibular joint on one side of the patient's jaw, whereas antenna 373 may be disposed at the joint on the opposite side of the patient's jaw. In another example, antenna 370 is disposed at one breast and antenna 373 is disposed on the opposite breast. In yet another example, the two antennas may be disposed over different regions of the patient's spine.

In a method according to one embodiment of the invention, utilizing the circuit of FIG. 8, the control computer of the MRI imaging apparatus actuates the RF transmitter to send two series of interleaved RF excitation pulses. As schematically depicted in FIG. 10, the two series of RF excitation intervals and two series of receive intervals are interleaved with one another. In the time graph of FIG. 10, $T_A$ represents a first excitation transmit interval and a first RF excitation pulse sent during such interval, $T_B$ represents a second excitation transmit interval and a second RF excitation signal, $R_1$ represents a first receive interval and the RF response signal received during that interval, whereas $R_2$ represents a second receive interval and RF response signal. As shown schematically in FIG. 10, the apparatus also provides magnetic field gradients coordinated with the excitation and response intervals. In a so-called "spin echo" imaging scheme as illustrated in FIG. 10, the system also actuates the RF transmitter to apply RF energy during first and second rephasing transmit intervals $T_c$ and $T_d$. The complete MRI imaging cycle includes many repetitions of the same operations, utilizing different gradient magnitudes in each repetition. Only two complete repetitions are shown in FIG. 10.

The control computer of the MRI imaging apparatus controls the slice selection gradient applied by the gradient field unit so that the transmitted RF will excite the nucleii in a slice of the patient adjacent the first antenna 370 during each first excitation transmit interval $T_a$ and during each first rephasing transmit interval $T_c$, and so that the transmitted RF will excite the nucleii in a slice of the patient adjacent the second antenna 373 during each second excitation transmit interval $T_b$ and during each second rephasing transmit interval $T_d$. The control computer further actuates switch 310 to the first and second positions alternately, so that the switch is in the first position, and connects the first antenna circuit 358 to the receiver 378 during each first receive interval $R_1$, whereas the switch is in the second position, and connects the second antenna circuit 359 to the receiver during each second receive interval $R_2$. The control computer actuates the image recovery unit to form one image based on the signals received during all of the first receive intervals and to form another image based on the signals received during all of the second receive intervals. In this manner, the system can acquire image information from separate parts of the patient's body during a single imaging cycle.

In a further embodiment of the procedure discussed above with reference to FIGS. 8 and 10, the two antenna circuits 358 and 359 are tuned to first and second resonant frequencies, respectively. The two resonant frequencies are matched to the resonant or Larmor frequencies of two different atomic species in the patient's body. The two antennas may be positioned at different parts of the patient's body, or at the same part. During each first excitation transmit interval $T_a$, and during each first rephasing transmit interval $T_c$, the control computer actuates the RF transmitter to transmit at the first resonant frequency. During the second transmit intervals $T_b$ and $T_d$, the control computer actuates the transmitter to transmit at the second resonant frequency. Here again, the switch is placed alternately into the first and second positions, so as to connect the receiver alternately to the first and second antenna circuits. Thus, during each first receive interval $R_1$, the receiver is connected to an antenna circuit 358 resonant at the first resonant frequency, whereas during each second receive interval the receiver is connected to the second antenna circuit 359 resonant at the second resonant frequency. This allows construction of MRI images representing a plurality of atomic species in a single MRI imaging cycle. For instance, if one antenna circuit 358 is tuned to the resonant frequency of protons (hydrogen nucleii) whereas the second antenna circuit 359 is tuned to the resonant frequency nitrogen nucleii, the system can provide separate images based on signals from the two different nucleii, or a composite image based on signals from both nucleii.

Figure 9:
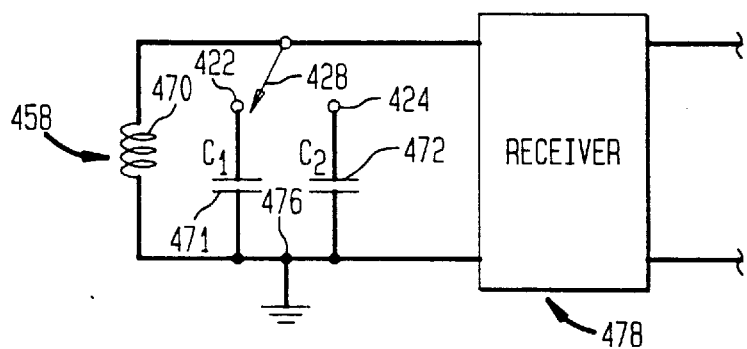

In a further embodiment of the invention, an antenna circuit 458 is permanently connected to receiver 478. Antenna circuit 458 includes the antenna coil or inductance 470 and either a first capacitance 471 or a second capacitance 472 of different value than the first capacitance (FIG. 9). Here again, switch 410 is arranged to switches between a first position and a second position. In the first position, the primary contact 428 connects to the first secondary contact 422, so that first capacitance 471 is incorporated in the antenna circuit and second capacitance 472 is disconnected. In this condition, antenna circuit 458 has a first resonant frequency. In the second position of the switch, the second capacitance is connected in antenna circuit 458, whereas the first capacitance is disconnected. In this second position, the antenna circuit has a second resonant frequency different from the first. This circuit can be used in the same manner as the circuit of FIG. 8 to acquire data representing different atomic species. Here again, the control computer actuates the RF transmitter to emit RF signals of different frequencies during first and second transmit intervals, and actuates the receiver to receive the resulting response signals at different frequencies during first and second receive intervals interleaved with one another.

Numerous variations and combinations of the features described above can be used. The spirit and scope of the appended claims should not be limited to the description of the preferred versions contained herein. For example, the switch can incorporate an "overcenter" or snap-action spring which biases the solenoid and movable contact toward the first position while they are in or near the first position, and tends to bias the solenoid and movable contact toward the second position when they are in or near the second position. In this arrangement, current would be applied to the coil only momentarily, so as to move the solenoid away from one position and most of the way to the opposite position. The spring would complete the motion to the opposite position and would maintain the solenoid and movable contact in the opposite position until the current is applied in the reverse direction. Also, electromagnets other than the helical solenoids discussed above can be used. For example, the electromagnet could be formed from one or more linear conductors. The electromagnet, and the primary or movable contact, need not pivot with respect to the frame, but can instead be arranged to slide linearly relative to the frame. Indeed, the movable portions of the device can be formed as a flexible element having one part fixedly mounted to the frame and having another part free to move upon bending of the flexible element. The devices used to mount the switch within the magnetic field of the MRI apparatus need not physically support the switch from the receiving antenna structure. Instead, the switch may be positioned on a separate strap which is attached to the patient's body located within the patient receiving space 63 of the MRI apparatus. Alternatively, the switch may be mounted within the patient-receiving space by a bracket attached to the MRI apparatus.

Also, the switch may have only one secondary or fixed contact. Thus, in the embodiment of FIGS. 1–5, the second secondary contact 24 may be omitted. In this arrangement, the antenna is open-circuited when the switch is in the second position. Alternatively, further circuit elements such as a capacitor may be connected between the second secondary contact 24 and node 76, so that the loop circuit formed in the second position of the switch will include these additional circuit elements. These elements may serve to detune the receiver antenna loop circuit, so that the receiver antenna is effectively inactive during the transmit interval.

As these and other variations and combinations of the features described above can be employed, the foregoing description of the preferred embodiments should be taken as merely illustrative of the invention defined by the claims.

What is claimed is:

1. An electromechanical switch for use in a magnetic resonance imaging apparatus which is operative for creating a first magnetic field, said switch comprising a frame of non-magnetic material, a first secondary contact supported by said frame, an electromagnet formed from non-magnetic material, said electromagnet being movably supported within said frame, and a primary contact mechanically connected to said electromagnet for movement therewith, said electromagnet and primary contact being movable between a first position in which said primary contact engages said first secondary contact and a second position in which said primary contact is disengaged from said first secondary contact, said electromagnet being arranged so that when in the presence of said first magnetic field, application of a current having a first polarity to said electromagnet will move said electromagnet and said primary contact to said first position, and so that application of a current having a second, opposite, polarity will move said electromagnet and said primary contact to said second position.

2. A switch as claimed in claim 1, wherein said electromagnet is pivotably supported on said frame for pivoting movement about a support axis.

3. A switch as claimed in claim 2, further comprising a second secondary contact mounted to said frame, said primary contact engaging said second secondary contact in said second position.

4. A switch as claimed in claim 3, wherein said secondary contacts are spaced apart from one another and said primary contact is disposed between said secondary contacts remote from said support axis.

5. A switch as claimed in claim 4, further including means for adjusting the spaced relationship of said secondary contacts.

6. The switch as claimed in claim 2, further comprising means for mounting said frame within a patient-receiving space of a primary field magnet so that said support axis is arranged orthogonal to said first magnetic field.

7. The switch as claimed in claim 1, wherein said electromagnet comprises a solenoid.

8. The switch as claimed in claim 7, wherein said solenoid comprises a body of non-magnetic material and a plurality of current carrying coils of non-magnetic material wound about said body.

9. The switch as claimed in claim 8, wherein said body is hollow and mounted to said frame for pivotal movement about a support axis, said primary contact being mounted within said body, said primary contact having a portion located remote from said support axis for contacting said secondary contacts upon pivoting of said body.

10. The switch as claimed in claim 1, further comprising means for applying said current, having said first and second polarities, to said electromagnet.

11. The switch as claimed in claim 1, further comprising means for mounting said frame within a patient receiving space of a primary field magnet in a magnetic resonance imaging apparatus.

12. The switch as claimed in claim 11, wherein said means for mounting said frame comprises means for supporting said frame on a receiving antenna structure.

13. The switch as claimed in claim 11, wherein said means for mounting said frame comprises means for securing said frame to a patient's body.

14. An electromechanical switch for use in a magnetic resonance imaging apparatus which is operative for creating a primary magnetic field, said switch comprising a frame of non-magnetic material, a pair of spaced apart secondary contacts supported by said frame, a solenoid comprising a body of non-magnetic material and a coil including a plurality of turns of non-magnetic material wound about said body and defining a solenoid axis, said solenoid being pivotably supported on said frame for movement about a support axis transverse to said solenoid axis, a primary contact mounted to said body for movement therewith between first and second positions, said primary contact having a portion located remote from said support axis for contacting said secondary contacts, and means for supporting said frame within a patient receiving space located within said primary magnetic field of said magnetic resonance imaging apparatus so that said support axis is disposed transverse to a primary magnetic field applied by a primary field magnet in said patient-receiving space, whereby upon application of a current having a first polarity to said coil of said solenoid in the presence of said primary magnetic field, said body will pivot about said support axis to move said primary contact to said first position and into electrical contact with one of said secondary contacts, and upon application of a current having a second polarity opposite to said first polarity to said coil of said solenoid in the presence of said primary magnetic field said body will pivot about said support axis to move said primary contact to said second position and into electrical contact with another of said secondary contacts.

15. The switch as claimed in claim 14, further comprising means for applying said current, having said first and second polarities, to said coils.

16. The switch as claimed in claim 14, further comprising means for adjusting the spaced relationship between said secondary contacts.

17. The switch as claimed in claim 14, wherein said means for mounting said frame within said patient-receiving space is arranged to mount said frame so that said solenoid axis does not pass through the body of a patient disposed in said patient-receiving space.

18. The switch as claimed in claim 17, wherein said means for mounting said frame includes means for mounting said frame to a structure of a receiving antenna adapted to encircle the body of a patient so that said solenoid axis does not pass through the antenna structure.

19. A magnetic resonance imaging apparatus comprising a primary field magnet having a patient-receiving space and adapted to create a primary magnetic field, a transmitter for providing an RF excitation signal within said patient-receiving space, a receiving antenna disposed within said patient-receiving space for capturing an RF response signal from a patient disposed within said patient-receiving space, a receiver for amplifying and receiving said RF response signal from said receiving antenna, and a switch comprising a frame of non-magnetic material, a first secondary contact supported by said frame, an electromagnet formed from non-magnetic material movably mounted to said frame and a primary contact mechanically connected to said electromagnet for movement therewith, said electromagnet and primary contact being movable relative to said frame between a first position in which said primary contact engages said first secondary contact and a second position in which said primary contact is disengaged from said first secondary contact, said electromagnet being arranged so that when in the presence of said primary magnetic field, application of a current having a first polarity to said electromagnet will move said electromagnet and said primary contact to said first position, and so that application of a current having a second, opposite polarity will move said electromagnet and said primary contact to said second position, said receiver being connected to said receiving antenna through said primary contact and said first secondary contact, whereby said receiver is connected to said receiving antenna only when said primary contact is in said first position, said apparatus further comprising selectively operable current applying means for passing currents of said first and second polarities through said coil to thereby move said primary contact between said first and second positions so as to connect said receiver to said receiving antenna and disconnect said receiver from said receiving antenna, and control means for actuating said transmitter during transmit intervals, actuating said receiver during receive intervals, and actuating said current applying means so as to keep said primary contact in said second position throughout each transmit interval and so as to keep said primary contact in said first position throughout each said receive interval.

20. Apparatus as claimed in claim 19, further comprising a second secondary contact mounted to said frame, said primary contact engaging said second secondary contact in said second position.

21. Apparatus as claimed in claim 20, wherein said receiving antenna is connected in a circuit through said primary contact and said second secondary contact when said primary contact is in said second position.

22. Apparatus as claimed in claim 21, wherein said receiver is connected to ground through said primary contact and said second secondary contact when said primary contact is in said second position.

23. Apparatus as claimed in claim 19, wherein said frame of said switch is mounted to said receiving antenna.

24. A magnetic resonance imaging apparatus as claimed in claim 19, wherein said transmitter is connected to said receiving antenna through said primary contact and said second secondary contact when said primary contact is in said second position, whereby said receiving antenna also serves as a transmitting antenna for applying RF signals in said patient receiving space.

25. A method of operating magnetic resonance imaging apparatus comprising the steps of providing a primary magnetic field in a patient-receiving space by operation of a primary field magnet of the magnetic resonance imaging apparatus, applying an RF excitation signal during transmit intervals, receiving RF response signals through a receiving antenna during receive intervals, the method further comprising the steps of directing electrical currents through an electromagnet movably mounted within said patient receiving space so that interaction between said currents and said primary magnetic field moves said electromagnet and a primary contact linked thereto between first and second positions so that said primary contact is in said first position and thereby connects a receiver to said receiving antenna during said receive intervals and so that said primary contact is in said second position and said receiver is disconnected from said antenna during said transmit intervals.

26. The method as claimed in claim 25, wherein said electromagnet is movably mounted on said antenna.

27. A method of operating magnetic resonance imaging apparatus comprising the steps of providing a primary magnetic field in a patient-receiving space by operation of a primary field magnet of the magnetic resonance imaging apparatus, applying an RF excitation signal during a series of transmit intervals and receiving RF response signals through a first receiving antenna during a series of first receive intervals interleaved between said transmit intervals, and receiving RF response signals through a second receiving antenna during a series of second receive intervals interleaved between said transmit intervals and said first receive intervals, the method further comprising the steps of directing electrical currents through an electromagnet movably mounted within said patient receiving space so that interaction between said currents and said primary magnetic field moves said electromagnet and a primary contact linked thereto between first and second positions between said first and second receive intervals to thereby connects a receiver to said first receiving antenna during each said first receive interval, and connect said receiver to said second receiving antenna during said each second receive interval.

28. A method as claimed in claim 27 wherein said first and second receiving antennas are disposed at different locations in said patient-receiving space, said response signals during each said first receive interval emanating from a region of a subject adjacent said first receive antenna, said response signals during each said second receive interval emanating from a region of a subject adjacent said second receive antenna.

29. A method of operating magnetic resonance imaging apparatus comprising the steps of providing a primary magnetic field in a patient-receiving space by operation of a primary field magnet of the magnetic resonance imaging apparatus, applying an RF excitation signal during a series of transmit intervals and receiving RF response signals of a first frequency through a receiver during a series of first receive intervals interleaved between said transmit intervals, and receiving RF response signals of a second frequency through said receiver during a series of second receive intervals interleaved between said transmit intervals and said first receive intervals, the method further comprising the steps of directing electrical tents through an electromagnet movably mounted within said patient receiving space so that interaction between said currents and said primary magnetic field moves said electromagnet and a primary contact linked thereto between first and second positions to thereby provide said receiver with a receive antenna circuit tuned to said first frequency during each first receive interval and provide said receiver with a receive antenna circuit tuned to said second frequency during each second receive interval.

\* \* \* \* \*

UNITED STATES PATENT AND TRADEMARK OFFICE
CERTIFICATE OF CORRECTION

PATENT NO. : 5,841,278
DATED : November 24, 1998
INVENTOR(S) : Green et al.

It is certified that error appears in the above-identified patent and that said Letters Patent is hereby corrected as shown below:

Column 9, line 42, delete "is".

Column 16, line 11, "connects" should read --connect--.

Column 16, line 35, "tents" should read --currents--.

Signed and Sealed this

Thirtieth Day of March, 1999

Attest:

Q. TODD DICKINSON

*Attesting Officer*    *Acting Commissioner of Patents and Trademarks*